United States Patent
Kushnarenko

(10) Patent No.: US 7,176,728 B2
(45) Date of Patent: Feb. 13, 2007

(54) HIGH VOLTAGE LOW POWER DRIVER

(75) Inventor: Alexander Kushnarenko, Haifa (IL)

(73) Assignee: Saifun Semiconductors Ltd, Netanya (IL)

( * ) Notice: Subject to any disclaimer, the term of this patent is extended or adjusted under 35 U.S.C. 154(b) by 12 days.

(21) Appl. No.: 10/774,806

(22) Filed: Feb. 10, 2004

(65) Prior Publication Data

US 2005/0174152 A1   Aug. 11, 2005

(51) Int. Cl.
*H03B 1/00* (2006.01)

(52) U.S. Cl. ...................................... 327/108
(58) Field of Classification Search ............... 327/108, 327/112, 333; 326/63, 68, 80–85, 87, 89, 326/91
See application file for complete search history.

(56) References Cited

U.S. PATENT DOCUMENTS

| | | | | |
|---|---|---|---|---|
| 4,733,105 A * | 3/1988 | Shin et al. | ............... | 327/333 |
| 4,961,010 A | 10/1990 | Davis | ............... | 326/27 |
| 5,029,063 A | 7/1991 | Lingstaedt et al. | ............... | 363/60 |
| 5,081,371 A | 1/1992 | Wong | ............... | 327/536 |
| 5,142,495 A | 8/1992 | Canepa | ............... | 365/189.09 |
| 5,142,496 A | 8/1992 | Van Buskirk | ............... | 365/201 |
| 5,276,646 A | 1/1994 | Kim et al. | ............... | 365/189.09 |
| 5,280,420 A | 1/1994 | Rapp | ............... | 363/60 |
| 5,381,374 A | 1/1995 | Shiraishi et al. | ............... | 365/203 |
| 5,534,804 A | 7/1996 | Woo | ............... | 327/143 |
| 5,553,030 A | 9/1996 | Tedrow et al. | ............... | 365/226 |
| 5,559,687 A | 9/1996 | Nicollini et al. | ............... | 363/60 |
| 5,581,252 A | 12/1996 | Thomas | ............... | 341/144 |
| 5,612,642 A | 3/1997 | McClintock | ............... | 327/143 |
| 5,636,288 A | 6/1997 | Bonneville et al. | ............... | 381/110 |
| 5,663,907 A | 9/1997 | Frayer et al. | ............... | 365/185.18 |
| 5,672,959 A | 9/1997 | Der | ............... | 323/273 |
| 5,675,280 A | 10/1997 | Nomura et al. | ............... | 327/538 |
| 5,708,608 A | 1/1998 | Park et al. | ............... | 365/189.05 |
| 5,717,581 A | 2/1998 | Canclini | ............... | 363/60 |
| 5,726,946 A | 3/1998 | Yamagata et al. | ............... | 365/226 |
| 5,760,634 A | 6/1998 | Fu | ............... | 327/391 |
| 5,808,506 A | 9/1998 | Tran | ............... | 327/537 |
| 5,815,435 A | 9/1998 | Van Tran | ............... | 365/185.03 |
| 5,847,441 A | 12/1998 | Cutter et al. | ............... | 257/530 |
| 5,880,620 A | 3/1999 | Gitlin et al. | ............... | 327/534 |

(Continued)

FOREIGN PATENT DOCUMENTS

EP    0693781    1/1996

(Continued)

OTHER PUBLICATIONS

Martin, "Improved Circuits for the Realization of Switched-Capacitor Filters", IEEE Transactions on Circuits and Systems, Apr. 1980, pp. 237-244, vol. CAS-27.

(Continued)

*Primary Examiner*—My-Trang Nu Ton
(74) *Attorney, Agent, or Firm*—Eitan Law Group

(57) ABSTRACT

A power driver circuit is provided including a low voltage source, a high voltage source, at least one input signal line, an output node, and circuitry adapted to connect the output node to the low voltage source when the input signal line is in a first state and to the high voltage source when said input signal line is in a second state.

14 Claims, 3 Drawing Sheets

U.S. PATENT DOCUMENTS

| | | | | |
|---|---|---|---|---|
| RE36,179 E | * | 4/1999 | Shimoda | 327/407 |
| 5,903,031 A | | 5/1999 | Yamada et al. | 257/356 |
| 5,910,924 A | | 6/1999 | Tanaka et al. | 365/226 |
| 5,946,258 A | | 8/1999 | Evertt et al. | 365/226 |
| 5,963,412 A | | 10/1999 | En | 361/111 |
| 6,005,423 A | | 12/1999 | Schultz | 327/143 |
| 6,028,324 A | | 2/2000 | Su et al. | 257/48 |
| 6,040,610 A | | 3/2000 | Noguchi et al. | 257/392 |
| 6,064,251 A | | 5/2000 | Park | 327/536 |
| 6,075,402 A | | 6/2000 | Ghilardelli et al. | 327/536 |
| 6,081,456 A | | 6/2000 | Dadashev | 365/165.23 |
| 6,094,095 A | | 7/2000 | Murray et al. | 327/589 |
| 6,107,862 A | | 8/2000 | Mukainakano et al. | 327/536 |
| 6,118,207 A | | 9/2000 | Ormerod et al. | 310/328 |
| 6,130,572 A | | 10/2000 | Ghilardelli et al. | 327/536 |
| 6,130,574 A | | 10/2000 | Bloch et al. | 327/536 |
| 6,150,800 A | | 11/2000 | Kinoshita et al. | 323/280 |
| 6,154,081 A | | 11/2000 | Pakkala et al. | 327/309 |
| 6,157,242 A | | 12/2000 | Fukui | 327/536 |
| 6,188,211 B1 | | 2/2001 | Rincon-Mora et al. | 323/280 |
| 6,198,342 B1 | | 3/2001 | Kawai | 327/536 |
| 6,208,200 B1 | | 3/2001 | Arakawa | 327/589 |
| 6,246,555 B1 | | 6/2001 | Tham | 361/18 |
| 6,285,614 B1 | | 9/2001 | Mulatti et al. | 365/207 |
| 6,297,974 B1 | | 10/2001 | Ganesan et al. | 363/60 |
| 6,339,556 B1 | | 1/2002 | Watanabe | 365/210 |
| 6,353,356 B1 | | 3/2002 | Liu | 327/536 |
| 6,356,469 B1 | | 3/2002 | Roohparvar et al. | 363/60 |
| 6,359,501 B2 | | 3/2002 | Lin et al. | 327/536 |
| 6,400,209 B1 | | 6/2002 | Matsuyama et al. | 327/534 |
| 6,433,624 B1 | | 8/2002 | Grossnickle et al. | 327/543 |
| 6,452,438 B1 | | 9/2002 | Li | 327/536 |
| 6,577,514 B2 | | 6/2003 | Shor et al. | 363/59 |
| 6,608,526 B1 | | 8/2003 | Sauer | 330/264 |
| 6,614,295 B2 | | 9/2003 | Tsuchi | 327/563 |
| 6,627,555 B2 | | 9/2003 | Eitan et al. | 438/710 |
| 6,654,296 B2 | | 11/2003 | Jang et al. | 365/189.09 |
| 6,665,769 B2 | | 12/2003 | Cohen et al. | 711/103 |
| 6,677,805 B2 | | 1/2004 | Shor et al. | 375/530 |
| 2002/0146465 A1 | | 10/2002 | Shor et al. | 327/536 |
| 2003/0076159 A1 | | 4/2003 | Shor et al. | 327/541 |
| 2003/0202411 A1 | | 10/2003 | Yamada | 365/203 |
| 2004/0151034 A1 | | 8/2004 | Shor et al. | 365/189.11 |

FOREIGN PATENT DOCUMENTS

| | | |
|---|---|---|
| EP | 0 843 398 | 5/1998 |
| JP | 02001118392 | 4/2001 |

OTHER PUBLICATIONS

Klinke, et al. "A Very-High-Stew-Rate CMOS Operational Amplifier", IEEE Journal of Solid-State Circuits, 1989, pp. 744-746. vol. 24.

Shor, et al, "paper WA2 04 01—Self regulated Four-Phased Charge Pump with Boosted Wells", ISCAS 2002.

Fotouhl, "An Efficient CMOS Line Driver for 1.544-Mb/s T1 and 2 048-Mb/s E1 Applications", IEEE Journal of Solid-State Circuits, 2003, pp. 228-236, vol. 38.

* cited by examiner

US 7,176,728 B2

HIGH VOLTAGE LOW POWER DRIVER

FIELD OF THE INVENTION

The present invention relates generally to voltage drivers, and particularly to a high voltage low power driver, that may be used, for example, to precharge a load by a low power source and then to continue charging the load by a high voltage source.

BACKGROUND OF THE INVENTION

Non-volatile memory (NVM) arrays, such as erasable, programmable read only memory (EPROM) or flash memory arrays, or electrically erasable, programmable read only memory (EEPROM) arrays, require high positive or negative voltages to program and erase memory cells of the array. NVM cells generally comprise transistors With programmable threshold voltages. For example, one type of non-volatile cell is a nitride, read only memory (NROM) cell, described in U.S. Pat. No. 6,011,725.

One procedure for programming bits, for example, in NROM cells, is by the application of programming pulses to Word lines and bit lines so as to increase the threshold voltage of the bits to be programmed. After application of one or more sets of programming pulses, the threshold voltages of the bits that are to be programmed may be verified to check if the threshold voltages have been increased to a target programmed state. Any bit that fails the program verify operation may undergo one or more additional programming pulses. The sequence of application of programming pulses followed by verification may then continue until all the bits that should be programmed have reached the target programmed state.

Read and write operations may be carried out using voltages that are regulated to be above a positive voltage supply Vdd. The circuitry that supplies and controls the programming and verification voltages may include a high voltage driver or high voltage pump.

Reference is made to FIG. 1, which illustrates a simplified block diagram of a voltage driver 10 with a model of output node. The voltage driver of FIG. 1 may include a line for input signal IN, a high voltage source HV that may be used as the source to drive the voltage, and an output line OUT that may carry the voltage from driver 10 to load 20. Output node $n_{OUT}$ may be charged by high voltage source HV through a PMOS (p-channel metal oxide semiconductor) transistor $P_0$ and may be discharged to ground through an NMOS (n-channel metal oxide semiconductor) transistor $N_0$. The drain of $P_0$ may be connected via $n_{OUT}$ to the source of $N_0$. However, the efficiency of a conventional voltage driver, such as the one shown in FIG. 1, is relatively low, reaching as low as 40%.

One solution to conserve high voltage power is to precharge the output node $n_{OUT}$ using a low voltage source prior to charging it using a high voltage source. Reference is made to FIG. 2, which illustrates a simplified block diagram of a high voltage driver 30 with Vcc pre charge. Components of the circuitry of FIG. 2 that are similar to that of FIG. 1 are designated with the same reference labels, and for the sake of brevity the description is not repeated. In the described high voltage driver 30 with Vcc precharge, a first high voltage input $IN_1$-P may control PMOS transistor $P_0$ and input $IN_1$-N may control NMOS transistor $N_0$ to charge high voltage, and a second high voltage input $IN_2$ may precharge output node $n_{OUT}$ to Vcc.

However, the above high voltage driver with Vcc precharge needs additional high voltage circuitry for generation of a second high voltage input signal $IN_2$, and current protection between Vcc, HV, and ground during switching of PMOS transistor $P_0$, and NMOS transistors $N_0$ and $N_1$.

For example, in order to open NMOS transistor $N_1$, which is dedicated to precharge output node $n_{OUT}$ to Vcc, the voltage of input $IN_2$ must be higher than Vcc plus the threshold voltage of $N_1$. To reach the desired voltage level, an additional voltage source, for example, HV, and a high voltage level shifter for transformation of low voltage input signal $IN_2$ to high voltage input signal $IN_1$-N and $IN_1$-P may be used.

An additional drawback of the described high voltage driver with Vcc precharge is the contention between HV and VCC. Input signal $IN_1$ in FIG. 2 is separated to two input signals, $IN_1$-P which is applied to the gate of PMOS transistor $P_0$ and $IN_1$-N which is applied to the gate of NMOS transistor $N_0$. However, this configuration raises practical difficulties in implementation. For example, before the high voltage phase, NMOS transistor $N_1$ has to be closed and only after it is closed PMOS transistor $P_0$ can be open. In any other configuration VCC and HV source will be shorted. Thus, the control of the switch between NMOS transistor $N_1$ and PMOS transistor $P_0$, without overlapping raises an additional difficulty. The non-overlapping signals for NMOS transistor $N_1$ and PMOS transistor $P_0$ influence also on the time required for the switching. Therefore, this kind of driver can not be used for fast switching schemes.

In addition, practical realization on of the described driver may be complicated in respect of the required silicon area, high voltage power consumed and loss of power for switching additional control signals. In addition, the described driver may suffer from other disadvantages.

Accordingly, there is a need for an efficient high voltage driver.

SUMMARY OF THE INVENTION

According to an embodiment of the present invention, there is provided a power driver circuit comprising a low voltage source, a high voltage source, at least one input signal line, an output node, and a circuitry adapted to connect said output node to said low voltage source when said input signal line is in a first state and to said high voltage source when said input signal line is changed to a second state.

According to an embodiment of the present invention, there is provided a method to drive power from a low voltage source and a high voltage source to an output node, the method comprising connecting said output node to said low voltage source when an input signal line is in a first state and to said high voltage source when said input signal line is changed to a second state.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

Figure 1:
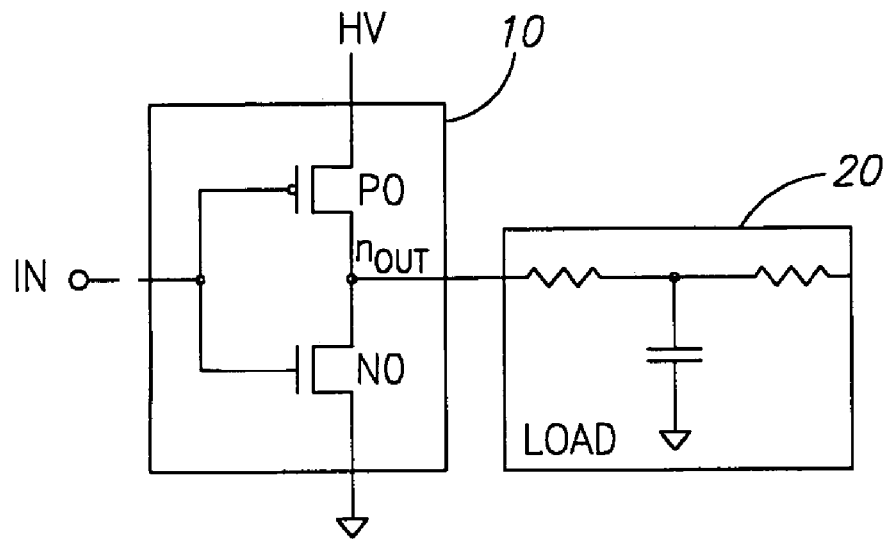
FIG. 1 is a simplified block diagram of a voltage driver.
Figure 2:
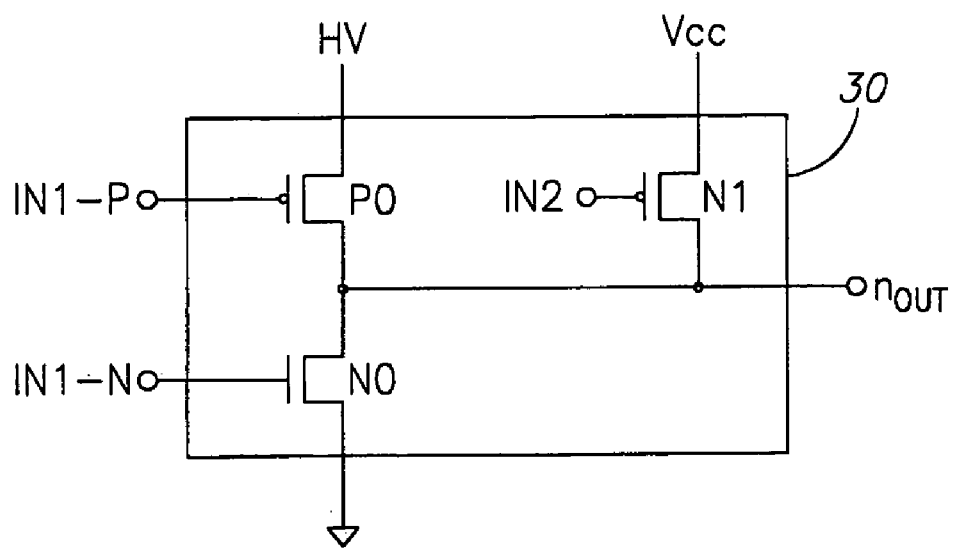
FIG. 2 is a simplified block diagram of a high voltage driver with Vcc pre-charge.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

Figure 3:
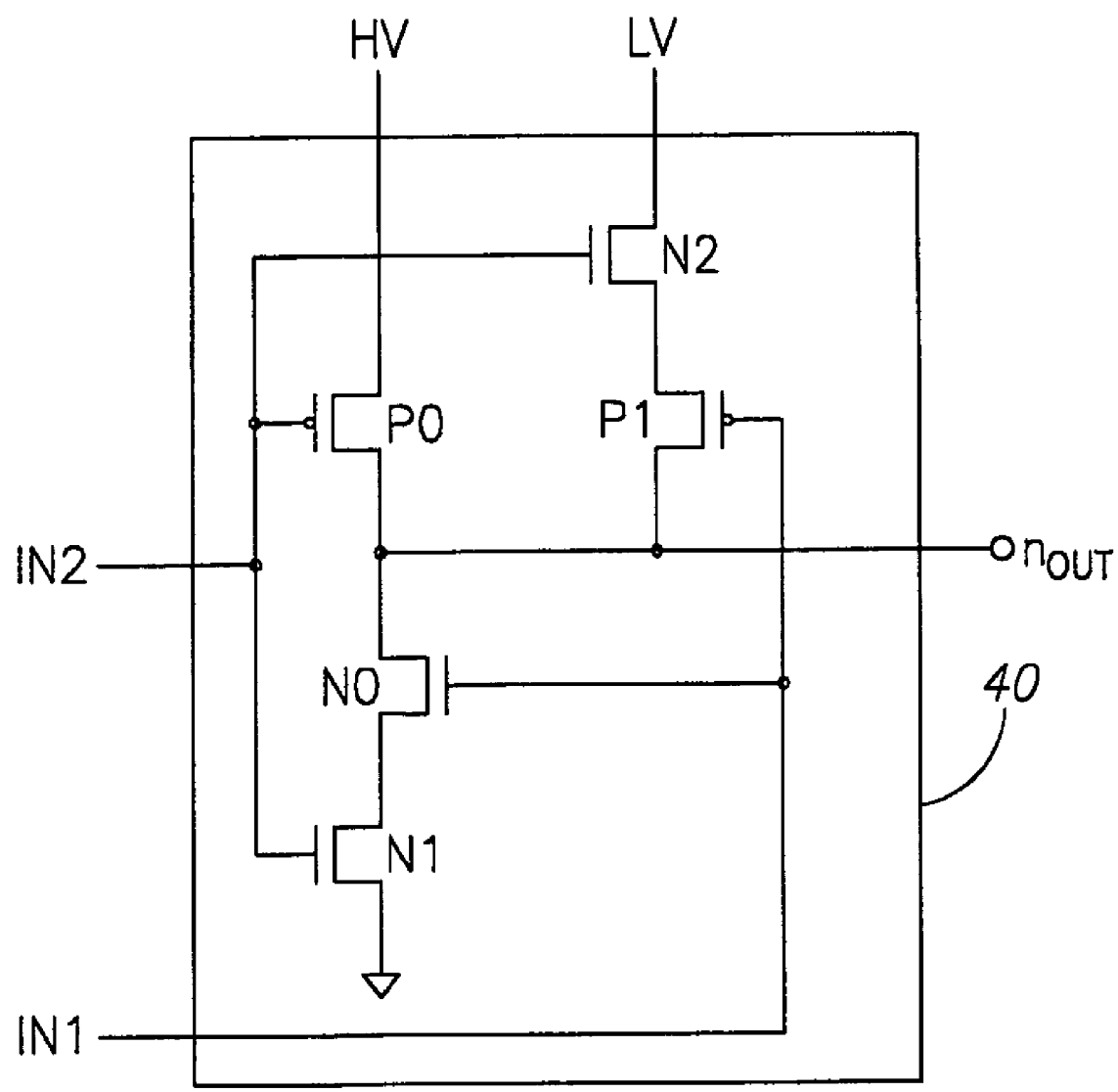
FIG. 3 is a block diagram illustration of a configuration of a high voltage driver in accordance with an embodiment of the present invention.

Reference is now made to FIG. 3 which is a block diagram illustration of a possible configuration of a high voltage low power driver 40 in accordance with an embodiment of the invention. According to an exemplary embodiment of the invention, an input signal line $IN_1$ may be used to charge the output node with a low voltage, and an input signal line $IN_2$ may be used to charge the output node with a high voltage. The driver 40 may have two voltage sources, low voltage source LV and high voltage source HV. In an exemplary embodiment of the invention, low voltage source LV may be tied to Vcc, and the voltage of high voltage source HV may be higher than the voltage of LV. An output line OUT may deliver the output voltage to a load.

In accordance with an exemplary embodiment of the invention depicted, in FIG. 3, NMOS transistor $N_0$ may be connected between output node and NMOS transistor $N_1$, and its gate may be connected to input $IN_1$. NMOS transistor $N_1$ may be connected between NMOS transistor $N_0$ and ground, and its gate may be connected to an input $IN_2$. NMOS transistor $N_2$ may be connected between low voltage source LV and PMOS transistor $P_1$, and its gate may be connected to an input $IN_2$. PMOS transistor $P_0$, may be connected between output node $n_{OUT}$, and high voltage source HV, and its gate may be connected to input $IN_2$. $P_1$ may be connected between output node $n_{out}$ and $N_2$ and its gate may be connected to input $IN_1$.

The configuration of the embodiment of the invention depicted in FIG. 3 may allow the driver to operate in several modes, including, for example, a low voltage mode, a high voltage mode, and an efficient discharge. The operation of an exemplary embodiment of the invention is explained in detail below; however, it will be understood by those of skill in the art that the invention is not limited in respect of the operation of the embodiment explained further below.

Figure 4:
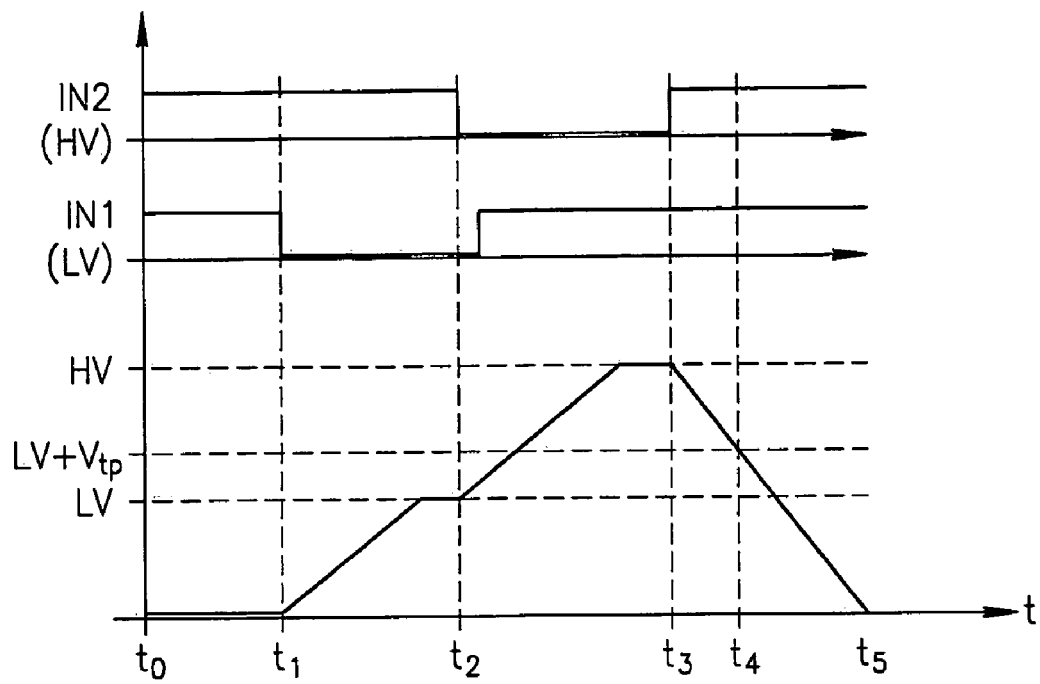
FIGS. 4 and 5 are simplified graphs of simulations of the operation of the driver of FIG. 3 in accordance with an embodiment of the invention.

Reference is made to FIG. 4, which is a simplified graph of a simulation of various signals involved in the operation of the driver of FIG. 3 over time, in accordance with an embodiment of the present invention.

As indicated at $t_0$–$t_1$ in FIG. 4, $IN_1$ and $IN_2$ may be non-activated, setting driver 40 to an off mode, in which substantially no voltage is sourced to the output node $n_{OUT}$, and any voltage stored in output node $n_{OUT}$ may be discharged and grounded through NMOS transistors $N_0$ and $N_1$.

When input signal $IN_1$ is switched ON and $IN_2$ remains OFF, output node $n_{OUT}$ may be pre-charged to approximately the voltage of LV through NMOS transistor $N_2$ and PMOS transistor $P_1$, as shown in period $t_1$–$t_2$ in FIG. 4.

As indicated at $t_2$–$t_3$ in FIG. 4, input signal $IN_2$ may then be switched ON. It will be noted that in the embodiment of the present invention shown in FIG. 3, switching $IN_2$ to an ON state, i.e., low voltage, results in at least two substantially simultaneous events. The path from the high voltage source HV to output node $n_{OUT}$ may be opened via $P_0$, thereby raising the voltage at output node $n_{OUT}$ to approximately high voltage HV; and the path from the low voltage source LV to output node $n_{OUT}$ may be closed via $N_2$. This simultaneous action of switching from a low voltage pre-charge to a high voltage power source may avoid contention between the sources LV and HV.

In accordance with an exemplary embodiment of the present invention shown in FIG. 3, as shown in $t_3$–$t_4$ in FIG. 4, when input $IN_2$ signal is switched OFF, e.g., returned to a high voltage level, and input signal $IN_1$ remains OFF, e.g., at a high voltage level, output node $n_{OUT}$ may discharge through two paths, for example, through $P_1$ and $N_2$ to LV, and through $N_0$ and $N_1$ to ground. Thus, for example, so long as the voltage at $n_{OUT}$ is higher than approximately the voltage of LV plus the threshold voltage of $P_1$, $n_{OUT}$ may discharge through $P_1$ and $N_2$, as well as to ground through $N_1$ and $N_2$. In this mode, a portion of the charge of output node $n_{OUT}$ may optionally be returned to the low voltage source LV.

Finally, as shown in $t_4$–$t_5$ in FIG. 4, when the voltage of output node $n_{OUT}$ reaches below LV plus the threshold voltage of $P_1$, $P_1$ shuts off, and output node $n_{OUT}$ discharges to ground through $N_1$ and $N_2$.

Figure 5:
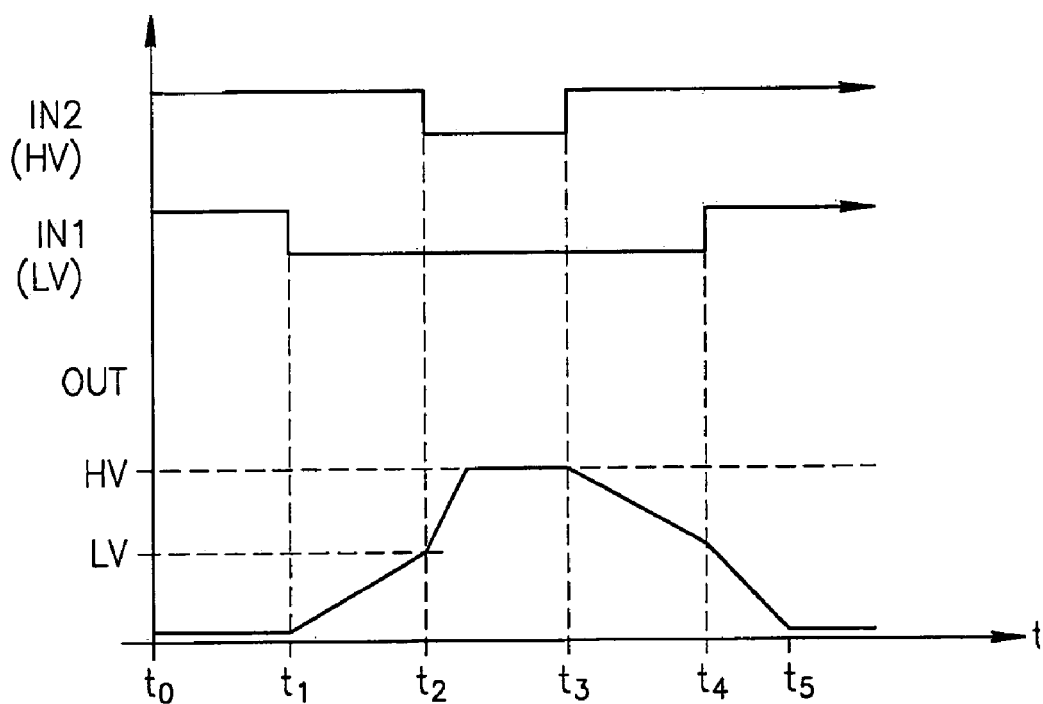

Reference is made to FIG. 5, which is a simplified graph of a simulation of various signals involved in the operation of the driver of FIG. 3 over time, in accordance with another method of operating an embodiment of the present invention.

As indicated at $t_0$–$t_1$, and similar to the description of FIG. 4, in FIG. 5, $IN_1$ and $IN_2$ may be non-activated, setting driver 40 to an off mode, in which substantially no voltage is sourced to the output node $n_{OUT}$, and any voltage stored in output node $n_{OUT}$ may be discharged and grounded through NMOS transistors $N_0$ and $N_1$.

When input signal $IN_1$ is switched ON and $IN_2$ remains OFF, output node $n_{OUT}$ may be pre-charged to approximately the voltage of LV through NMOS transistor $N_2$ and PMOS transistor $P_1$, as shown in period $t_1$–$t_2$ in FIG. 5, which is also shown in FIG. 4.

As indicated at $t_2$–$t_3$ in FIG. 5, when input signal $IN_2$ is switched ON, $IN_2$ may open the path to the high voltage source HV, and $P_0$ may connect high voltage source HV to output node $n_{OUT}$, thereby raising the voltage at output node $n_{OUT}$ to approximately high voltage HV.

In accordance with an exemplary embodiment of the present invention shown in FIG. 3, as shown in $t_3$–$t_4$ in FIG. 5, input $IN_2$ signal may be returned to OFF mode while $IN_1$ remains in ON mode. In this mode, output node $n_{OUT}$ may discharge through $P_1$ and $N_2$ to LV, for example, as long as the voltage at $n_{OUT}$ is higher than approximately the voltage of LV plus the threshold voltage of $P_1$. Thus, in this mode, a portion of the charge of output node $n_{OUT}$ may be returned to the low voltage source LV.

Finally, as shown in $t_4$–$t_5$ in FIG. 5, input $IN_1$ signal may be returned to OFF mode while $IN_2$ remains in OFF mode. In this mode, output node $n_{OUT}$ may discharge its remaining charge to ground.

It will be appreciated by persons skilled in the art that the present invention is not limited by what has been particularly shown and described herein above. For example, although particular NMOS and PMOS components have been described in the particular configuration above, it will be understood that other components and configurations may be employed within the bounds of the invention, and that the invention is not limited in this regard. For example, CMOS transitors may be used instead of PMOS and NMOS transistors, and the time diagrams of IN1 and IN2 may also be changed.

The invention claimed is:

1. A power driver circuit comprising: a low voltage source; a high voltage source; a first input node; an output node; and circuitry adapted to connect said output node to said low voltage source when a signal at said first input node is in a first state and to said high voltage source when said signal at said first input node is changed to a second state; and said circuit further comprising a second input node, wherein said circuitry comprises: low voltage switching circuitry adapted to connect said output node to said low voltage source when signals at said first and second input nodes are in a low voltage configuration; high voltage switching circuitry adapted to connect said output node to said high voltage source when signals at said first and second input nodes are in a high voltage configuration; and ground switching circuitry adapted to connect said output node to ground when signals at said first and second input nodes are in a ground configuration.

2. The power driver circuit of claim 1, wherein said low voltage switching circuitry comprises a first low voltage activation switch activated by said signal at said second input node and a second low voltage activation switch activated by said signal at said first input node.

3. The power driver circuit of claim 2, wherein said second low voltage activation switch is an inverted switch.

4. The power driver circuit of claim 2, wherein said switches are NMOS transistors.

5. The power driver circuit of claim 2, wherein said inverted switches are PMOS transistors.

6. The power driver circuit of claim 2, wherein said inverted switches are CMOS transistors.

7. The power driver circuit of claim 1, wherein said high voltage switching circuitry comprises a high voltage activation switch activated by said signal at said second input node.

8. The power driver circuit of claim 7, wherein said high voltage activation switch is an inverted switch.

9. The power driver circuit of claim 1, wherein said ground circuitry comprises a first grounding switch activated by said signal at said first input node and a second grounding switch activated by said signal at said second input node.

10. The power driver circuit of claim 1, wherein said low voltage source is Vcc.

11. A method to drive power from a low voltage source and a high voltage source to an output node, the method comprising:

connecting said output node to said low voltage source when a signal at a first input node is in a first state and to said high voltage source when a signal at said first input node is changed to a second state; and connecting said output node to ground when said signal at said first input node is in said first state and when a signal at a second input node is changed from a first state to a second state.

12. The method of claim 11, wherein said connecting said output node to, said high voltage source when a signal at said first input node is in said second state comprises providing a high voltage on signal at said first input node to a switch connecting said output node to said low voltage source.

13. The method of claim 11, wherein said connecting said output node to said low voltage source when a signal at said first input node is in said first state comprises providing a low voltage off signal at said first input node to a switch connecting said output node to said low voltage source.

14. The method of claim 11 comprising: connecting said output node to said low voltage source after disconnecting said output node from said high voltage source, thereby charging said low voltage source.

* * * * *